United States Patent
Hsu

(10) Patent No.: US 6,483,703 B2
(45) Date of Patent: Nov. 19, 2002

(54) RETAINING CLAMP FOR COOLING FINS

(75) Inventor: Hsien-Keng Hsu, Ping Tung (TW)

(73) Assignees: Ray Long Enterprise Co., Ltd., Ping Tung (TW); Asia Vital Components Co., Ltd., Kaohsiung (TW)

( * ) Notice: Subject to any disclaimer, the term of this patent is extended or adjusted under 35 U.S.C. 154(b) by 31 days.

(21) Appl. No.: 09/799,536

(22) Filed: Mar. 7, 2001

(65) Prior Publication Data

US 2002/0126451 A1 Sep. 12, 2002

(51) Int. Cl.$^7$ .................................................. H05K 7/20
(52) U.S. Cl. ...................... 361/704; 361/707; 257/707; 174/16.3; 165/80.3
(58) Field of Search ................................ 361/690, 700, 361/704, 707, 702, 703–706, 708–714, 717–720, 722, 687, 688, 689; 174/16.3, 52.1, 252; 24/457–459, 518, 524, 517, 295; 165/80.2, 80.3, 80.4, 185; 257/706–727; 248/505, 510, 316.7; 439/487, 330, 331, 525, 73, 607; 411/352, 516, 522, 533

(56) References Cited

U.S. PATENT DOCUMENTS

| | | | | |
|---|---|---|---|---|
| 5,367,253 A | * | 11/1994 | Wood et al. ............. 324/158.1 |
| 5,617,292 A | * | 4/1997 | Steiner ........................ 361/704 |
| 5,671,118 A | * | 9/1997 | Blomquist ................... 361/704 |
| 5,933,325 A | * | 8/1999 | Hou ............................ 361/704 |

* cited by examiner

*Primary Examiner*—Gerald Tolin
*Assistant Examiner*—Michael Datskovsky
(74) *Attorney, Agent, or Firm*—Bacon & Thomas, PLLC

(57) ABSTRACT

A retaining clamp for cooling fins comprises a L-shaped retaining lever, a resilient component, and a detachable lever. The L-shaped retaining lever is an elongated lever provides a fixing component at the bottom thereof. An end of the L-shaped retaining lever extends a vertical bent part with a locking hook, and the other end thereof is a narrow hanging part. The resilient component is disposed beneath the L-shaped retaining lever and fixed by the fixing component. The detachable lever has an end thereof extend a handle, and has the other end thereof provide a hook. A hanging groove is on the detachable lever between two ends thereof for being passed through by the hanging part on the L-shaped retaining lever. No flexibility is necessary for the L-shaped retaining lever so that no heat treatment is required and it does not result in deformation. The resilient component can have a changeable height to accommodate cooling fins indifferent sizes. An unbalancing force may not generate resulting from vibration so that loosening can be avoided. The retaining clamp of the present invention can be set up and detached much more easily.

8 Claims, 4 Drawing Sheets

RETAINING CLAMP FOR COOLING FINS

BACKGROUND OF THE INVENTION

1. Field of the Invention

The present invention relates to a retaining clamp for cooling fins, and particularly to an improved retainer clamp adaptable for fixing cooling fins in different sizes firmly.

2. Description of Related Art

Presently, it is known that the computer is one of required equipment for an individual or a company and it is much emphasized by the user that if the running speed of computer is fast or not. However, the central processing unit (CPU), the printer, and chips for the computer having a high executing speed may result in a problem of overheat to damage the CPU, chips and etc. in the computer. In order to reduce the temperature of the CPU effectively, extruded aluminum cooling fins with fan have been provided on the CPU to dissipate the generated heat. Nevertheless, the executing speed of the CPU is getting higher to result in an increasing rotation speed of fan correspondingly. In order to mount and detach the extruded aluminum cooling fins with fan conveniently and to allow the fan running steadily, a way has been done that the CPU is coated with adhesive to fix the cooling fins with fan. Another way is that a retainer is utilized to hook the cooling fins firmly over the bearing base for the CPU. A conventional retainer as shown in FIG. 1 or 2 basically is a L-shaped retaining lever 10' made of bent elastic steel. The L-shaped lever 10' includes an elongated lever part 11', and a vertical lever part 12' extending from an end of the elongated lever 11'. The vertical lever 12' has a locking hook end 13' and the other end of elongated lever 11' connects a hook 32'. The middle part of the elongated lever part 11' has a downward bend. Because the L-shaped lever 10' is made of elastic bent steel, there are following shortcomings in spite of being able to fasten the cooling fins to the bearing base of CPU:

(1) The main body of conventional retainer is made of elastic material and it may result in distortion during heat treatment.

(2) Because of falling down to the floor or being impacted, the shock caused may result in a co-vibration force due to up and down and left and right oscillations such that the retainer occurs a phenomenon of loosening.

(3) The cooling fins provide different sizes to accommodate different models of CPU specifications. In order to meet different requirements in size, it is necessary for the conventional retainer being made in different sizes such that the production cost including the mold tool becomes much higher.

SUMMARY OF THE INVENTION

The retaining clamp for cooling fins according to the present invention resides in that a fixing part is provided on an non-elastic L-shaped retaining lever to hold a resilient piece instead of the conventional elastic L-shaped retaining lever. Thus, an unbalanced distortion of L-shaped retaining lever may avoid during being processed by way of heat treatment. In addition, the resilient piece can be changed in height to accommodate different sizes of cooling fins. Hence, the retainer of the present invention is unable to be loosened while an up and down co-vibration is caused due to impact. Meanwhile, the retainer clamp of the present invention is set up and detached easily and effectively.

An object of the present invention is to provide a retainer clamp for cooling fins, in which a fixing part is arranged on an elongated lever part of L-shaped retaining lever to hold a resilient piece with a V-shaped tip for being biased to press against the cooling fins by way of a detachable lever with a hook part and a locking hook on the L-shaped retaining lever engaging with the bearing base of the CPU. Because the L-shaped retaining lever does not provides elastic force, the iron sheet (SPC), the galvanized steel sheet (SECC), the stainless steel (SUS304) or the fiber reinforced plastics can be utilized as the material thereof, it has no the defect of unbalanced distortion as the elastic material adopted by the prior art does while the heat treatment is processed. Furthermore, due to the L-shaped retaining lever being made of non-elastic material, the vibration resulting from falling down to the floor or impact only makes the resilient piece generate an oscillation force moving up and down without any co-vibration forces moving left and right as the prior art does. Hence, the retaining clamp for cooling fins does not loosen easily.

Another object of the present invention is to provide a retaining clamp for cooling fins, in which the resilient piece has its V-shaped tip pressing against the cooling fins to concentrate the pressing force at the central pressing point thereof and the distance between the resilient piece and the cooling fins can be controlled easily. Hence, only the resilient piece such as leaf spring or spring requires to be replaced and it is not necessary to replace the entire retaining clamp. Thus, the extra production cost including the expense of mold tool for making the retaining clamp may be saved tremendously.

A further object of the present invention is to provide a retaining clamp for cooling fins, a detachable lever with hook part is arranged to engage with the bearing base of CPU and detachably fits with a hanging part on the L-shaped lever. Furthermore, a handle part is on the detachable lever such that the detachable lever can be mounted to and detached from the L-shaped lever much more easily.

A further object of the present invention is to provide a retaining clamp for cooling fins, in which the L-shaped retaining lever at both lateral sides thereof is formed a reinforced rib respectively to strengthen the L-shaped retaining lever and the resilient piece.

A further object of the present invention is to provide a retaining clamp for cooling fins, in which reinforced ribs at the hanging part on the L-shaped lever has a chamfer respectively and a raised point is on the hanging part corresponding to a projection part surrounded by a fitting groove on the detachable lever. Hence, the detachable lever can be attached to and detached from the L-shaped retaining lever much more easily.

BRIEF DESCRIPTION OF THE DRAWINGS

The present invention can be more fully understood in the following description with reference to accompanying drawings, in which.

DETAILED DESCRIPTION OF THE PREFERRED EMBODIMENT

Figure 1:
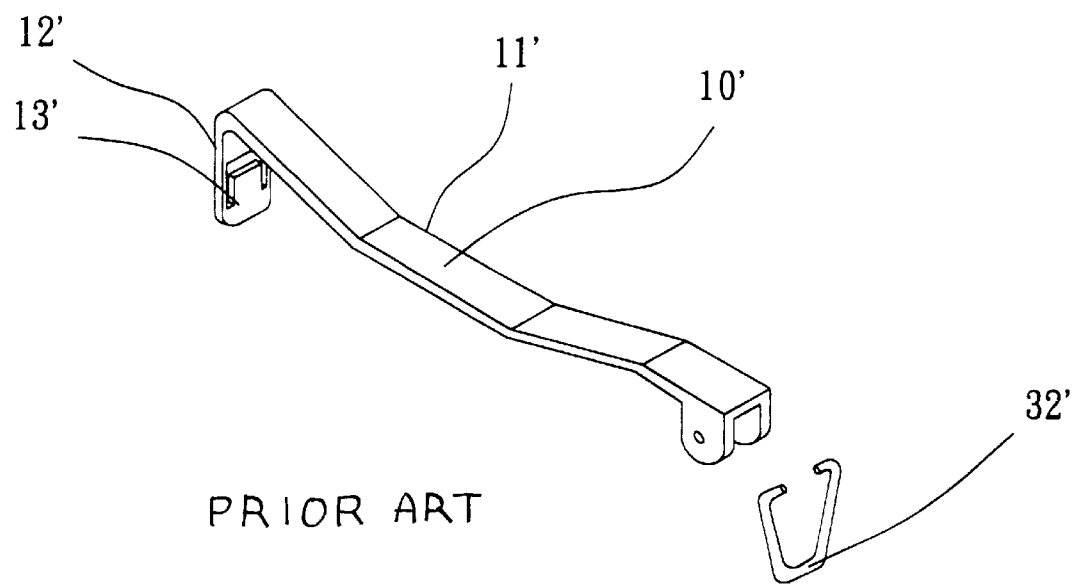
FIG. 1 is a perspective view of a conventional retaining clamp for cooling fins.
Figure 2:
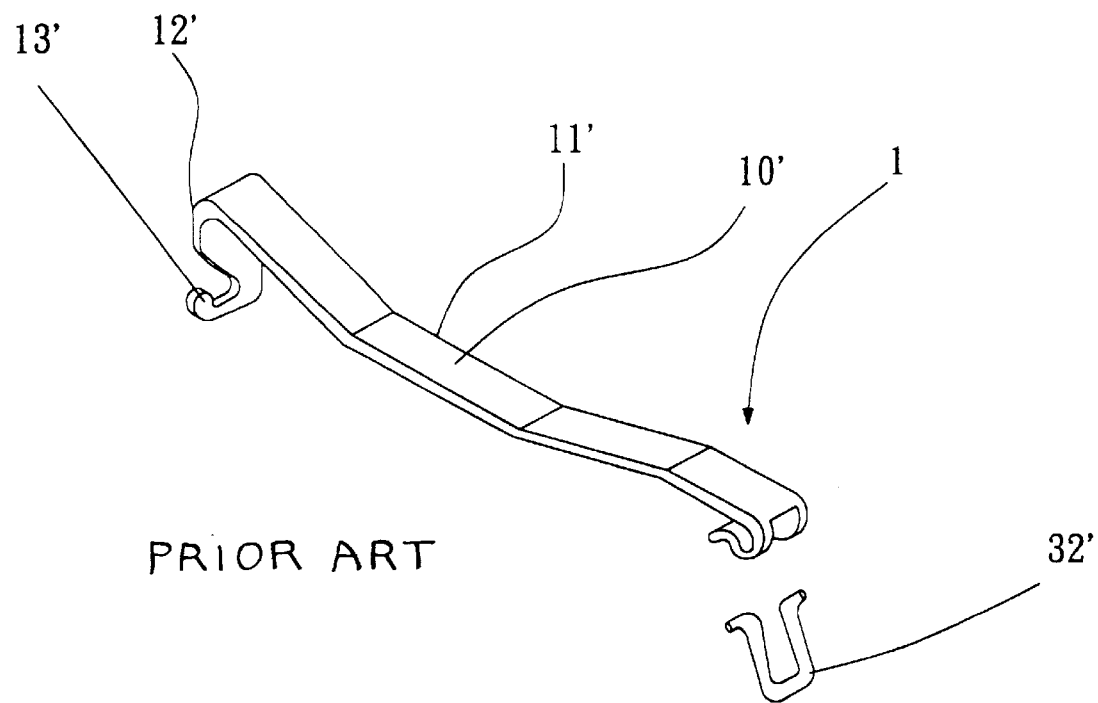
FIG. 2 is a perspective view of another conventional retaining clamp for cooling fins.
Figure 3:
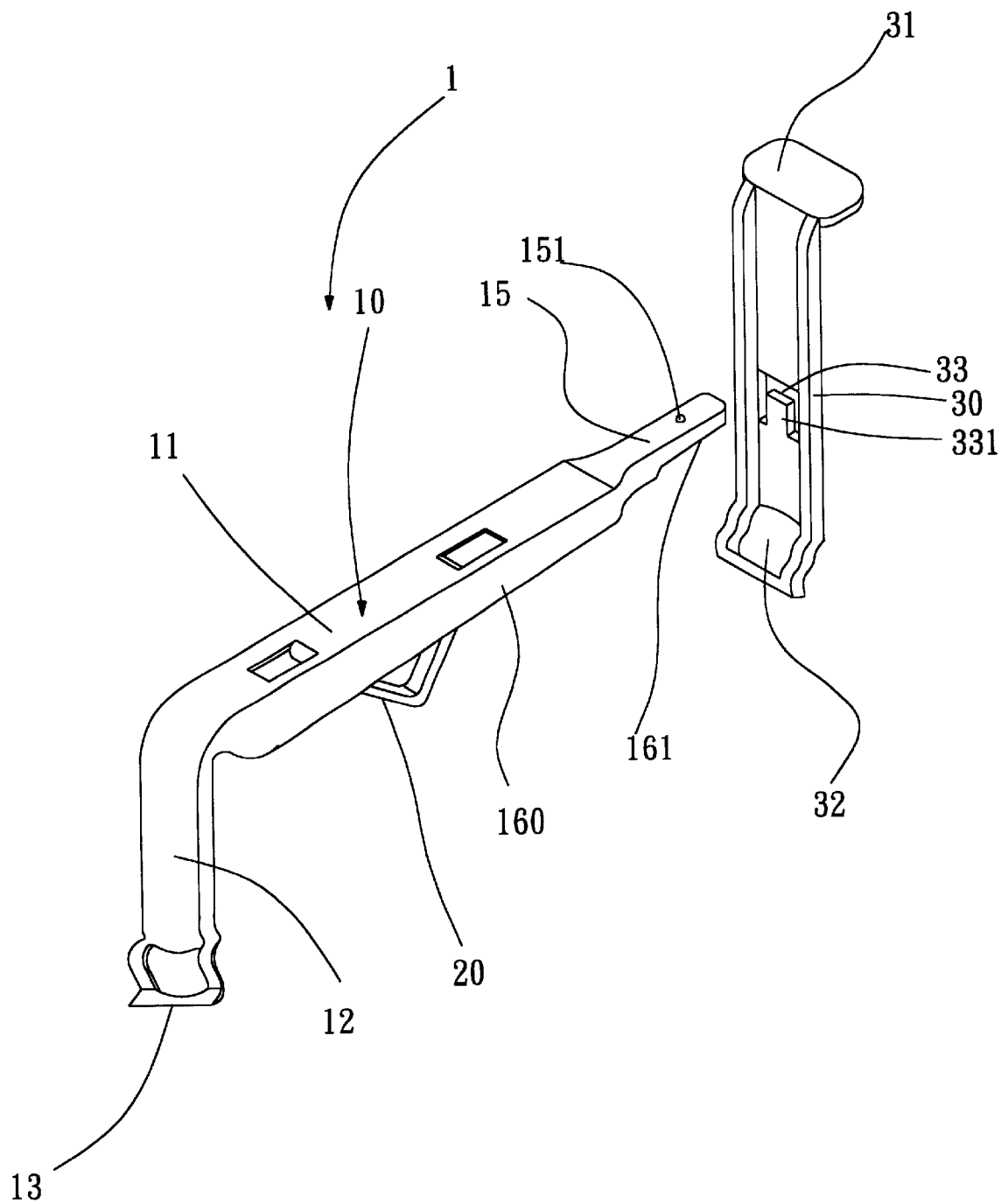
FIG. 3 is a perspective view of a retaining clamp for cooling fins according to the present invention.
Figure 5:
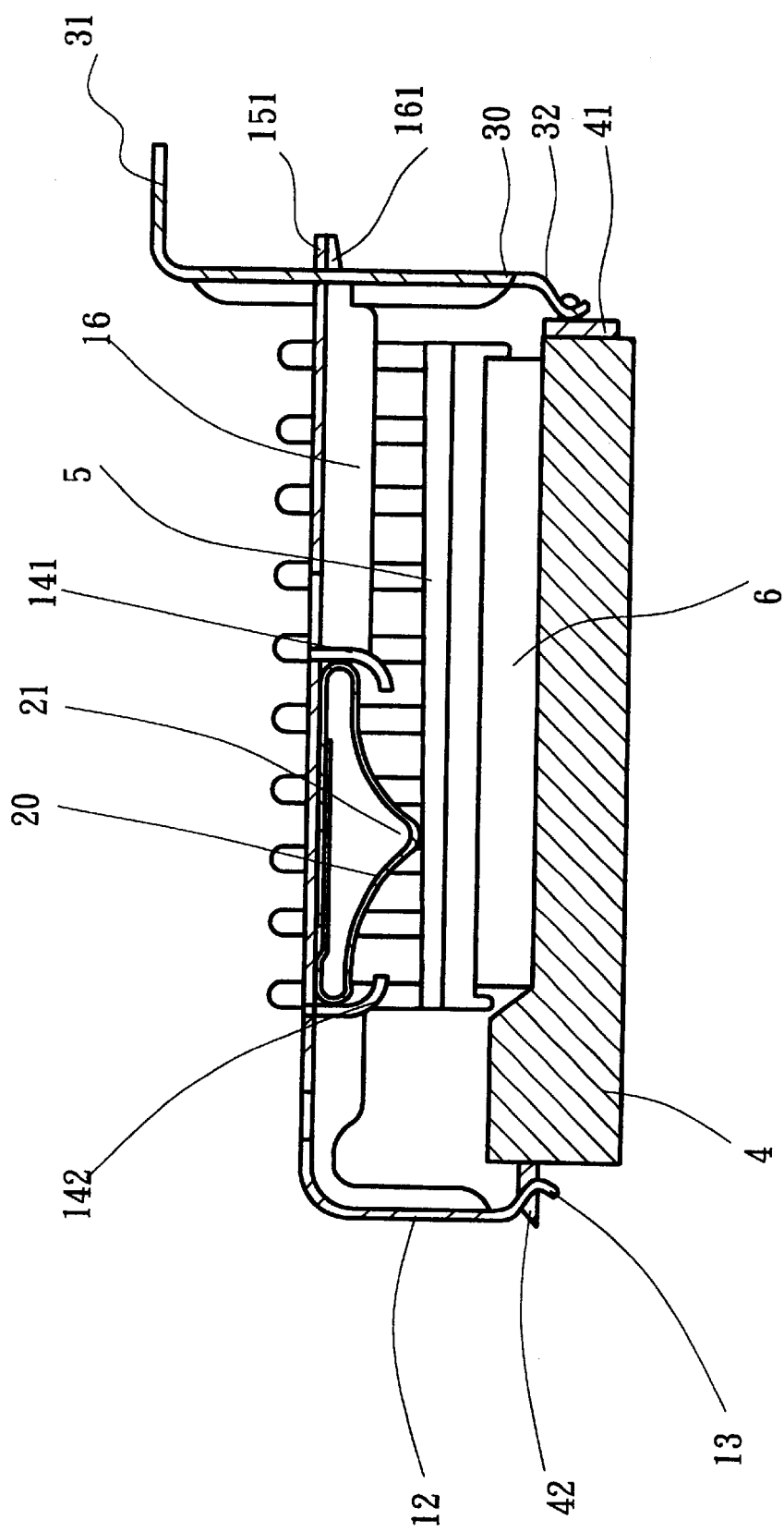
FIG. 5 is a sectional view of FIG. 4 illustrating the retaining clamp in a state of fastening to the cooling fins in much more detail.

First of all, referring to FIGS. 3 and 5, a retaining clamp for cooling fins according to the present invention, which is attached to a central processor unit (CPU) in a computer, comprises a L-shaped retaining lever 10, a resilient piece 20, and a detachable lever 30.

The L-shaped retaining lever 10 is an elongated lever part 11 with a vertically bent lever part 12. A locking hook 13 is provided at the end of bent lever part 12 and the elongated lever part 11 has been pressed two opposite downward hooks 141, 142. The elongated lever part 11 at a free end thereof provides a narrow hanging part 15 with a raised point 151 to keep the detachable lever 30 off falling while the detachable lever 30 is attached to the hanging part 15. Both lateral sides of the L-shaped retaining lever 10 are formed a reinforced rib 16 respectively to strengthen the L-shaped retaining lever 10 and the resilient piece 20. The respective reinforced rib 16 at the hanging part 15 is arranged a chamfer 161.

The resilient piece 20, which is V shape and made of leaf spring, is placed under the elongated lever part 11 and fixed by the two opposite hooks 141, 142.

The detachable lever 30 at an end thereof extends a handle 31 and at the other end thereof provides a hook part 32. The middle portion of the detachable lever 30 is pierced a fitting groove 33 for the hanging part 15 on the L-shaped retaining lever 10 being able to pass through and a projection part 331 is formed surrounding the fitting groove 33. The detachable lever 30 is passed through by the hanging part 15, and then located by the chamfers 161 at the bottom of hanging part 15.

Figure 4:
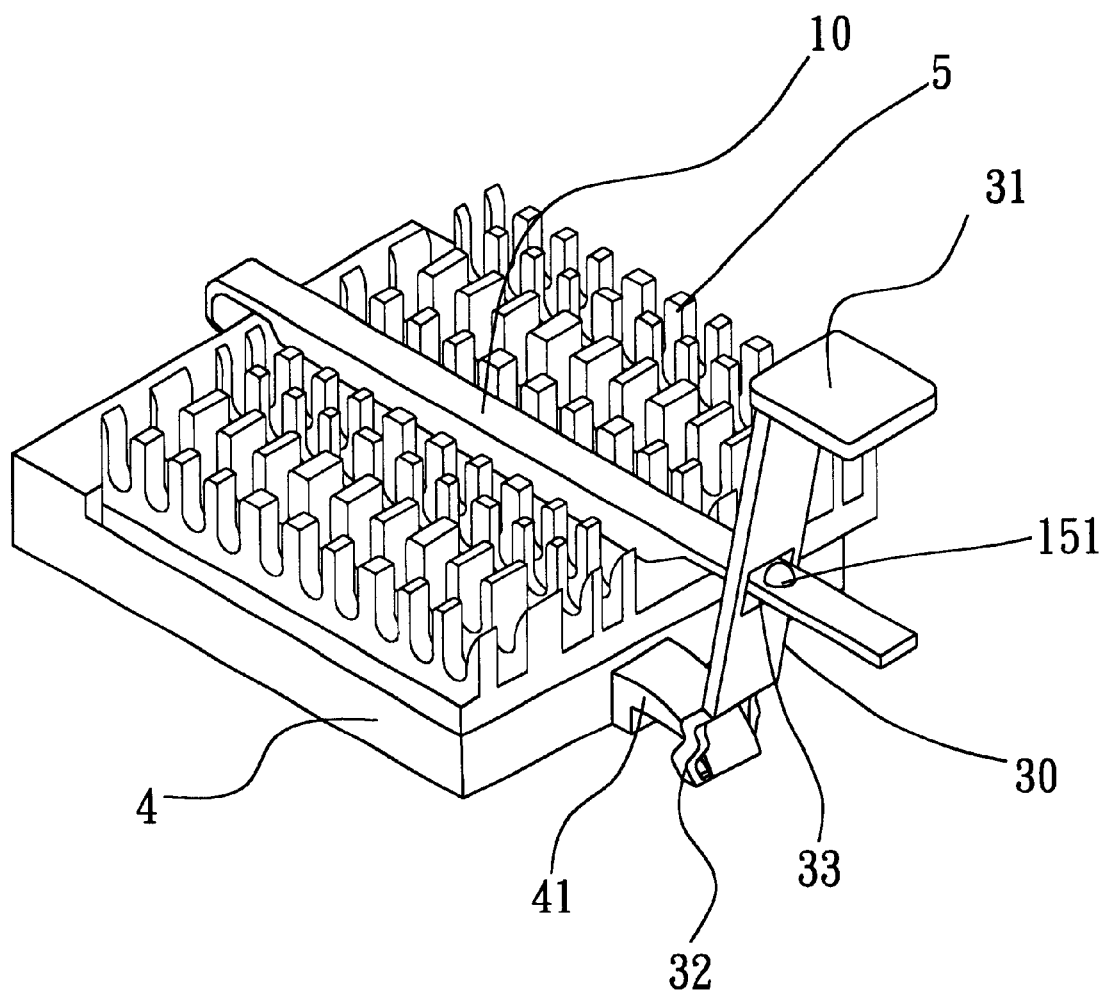
FIG. 4 is a perspective view illustrating the retaining clamp of the present invention fastening to the cooling fins.

Next, referring to FIG. 4 and accompanying FIG. 5 again, the locking hook 13 on the L-shaped retaining lever 10 and the hook part 32 on the detachable lever 30 engage with two opposite engaging ears 41, 42 on the base 4 respectively. The base 4 is fixed to the central processing unit (CPU) 6 of main board in a computer. The tip 21 of V-shaped resilient piece 20 then is biased to press against the cooling fins 5 and the CPU 6 underneath. The L-shaped retaining lever 10 can be made of iron sheet (SPC), galvanized iron sheet (SECC), stainless steel (SUS304), or fiber reinforced plastics. Because the L-shaped retaining lever 10 is non-elastic material, the defect such as distortion caused by heat treatment can be avoided and an unbalancing force may not generate while the cooling fins are attached to the CPU by the retaining clamp of the present invention firmly without loosening. In addition, the pressing force concentrates to the central point of the cooling fins so that the distance between the pressing force and the cooling fins is easily controlled. In order to fit the size of cooling fins, it is only necessary to replace the resilient piece such as leaf spring or spring without the need of replacing the entire retaining clamp for saving the production cost including the expense of mold tool. Moreover, the reinforced ribs at both lateral sides of the hanging part provides a chamfer respectively and a raised point is arranged thereon to detachably fit with the projection part in the fitting groove on the detachable lever without loosening. Furthermore, a handle part is provided on the detachable lever to allow the detachable lever engaging with the L-shaped retaining lever much more easily.

While the invention has been described with reference to a preferred embodiment, it is to be understood that modifications and variations may be easily made without departing from the spirit of this invention defined by the appended claim.

What is claimed is:

1. A retaining clamp for cooling fins, comprises
    a L-shaped retaining lever with two ends, being an elongated lever, providing a fixing part, an end thereof extending a vertical bent part with a locking hook, the other end thereof being a narrow hanging part;
    a resilient piece, being disposed beneath the L-shaped retaining lever and fixed by the fixing part; and
    a detachable lever with two ends, an end thereof extending a handle, the other end thereof providing a hook, having a fitting groove between said two ends to be passed through by the hanging part on the L-shaped retaining lever.

2. The retaining clamp for cooling fins as defined in claim 1, wherein the L-shaped retaining lever has two bent lateral sides as reinforced ribs.

3. The retaining clamp for cooling fins as defined in claim 1, wherein a raised point is provided on the hanging part of L-shaped retaining lever.

4. The retaining clamp for cooling fins as defined in claim 1, wherein the fixing part is made on the elongated lever part by way of pressing to form two opposite hooks.

5. The retaining clamp for cooling fins as defined in claim 2, wherein the reinforced ribs at the hanging part have a chamfer respectively and a projection part is surrounded by the fitting groove.

6. The retaining clamp for cooling fins as defined in claim 1, wherein the resilient piece is a leaf spring or spring.

7. The retaining clamp for cooling fins as defined in claim 1, wherein the resilient piece is inverse V shape and positioned at a bottom of the L-shaped retaining lever to be held by the fixing part.

8. The retaining clamp for cooling fins as defined in claims 1 or 5, wherein the detachable lever at two lateral sides thereof is bent as a reinforced rib respectively.

* * * * *